Dec. 1, 1970 | A. LICHOWSKY | 3,544,860

INTEGRATED POWER OUTPUT CIRCUIT

Filed April 11, 1968 | 2 Sheets-Sheet 1

INVENTOR
ABRAHAM LICHOWSKY

BY Robert P. Williams
ATTORNEY

Dec. 1, 1970 A. LICHOWSKY 3,544,860

INTEGRATED POWER OUTPUT CIRCUIT

Filed April 11, 1968 2 Sheets-Sheet 2

INVENTOR
ABRAHAM LICHOWSKY

BY Robert P. Williams
ATTORNEY 3,544,860
INTEGRATED POWER OUTPUT CIRCUIT
Abraham Lichowsky, Los Angeles, Calif., assignor to RCA Corporation, a corporation of Delaware
Filed Apr. 11, 1968, Ser. No. 720,509
Int. Cl. H01l 11/00
U.S. Cl. 317—235 3 Claims

ABSTRACT OF THE DISCLOSURE

An integrated power output circuit includes several transistors connected as Darlington pairs. The transistors are arranged in adjacent parallel rows, with one transistor of each pair in each of the rows. The several pairs are connected in parallel with a single metallization layer which requires no lead crossings. Series base resistance is provided, in the input to each pair and is utilized to aid in equalizing the current flow among all the pairs.

BACKGROUND OF THE INVENTION

This invention relates to semiconductor integrated circuits and more particularly to a monolithic integrated power output circuit adapted to be used in combination with other integrated circuitry, such as receiver or transmitter circuitry and the like.

Heretofore, integrated circuits adapted to carry relatively high currents have required either single active devices of large area or many interconnected smaller devices. Circuits employing single large area devices have had excessive lead resistance. In circuits having plural devices, the leads between the devices have usually been required to cross each other at some point, thus introducing extra steps and higher cost into the fabrication process. In both types of circuits, non-uniform circuit resistance to elemental portions of the circuit results in current hogging in small portions thereof. This phenomenon severely limits the size and power handling capability of the circuit.

SUMMARY OF THE INVENTION

The present power output circuit has a plurality of transistors which are interconnected without lead crossings. The transistors of the circuit are arranged in adjacent parallel rows with conductors extending between the devices to interconnect them as a plurality of pairs connected in parallel. These conductors are arranged such that none of them crosses any other. The circuit may include means for providing effective current equalization over relatively large areas.

THE DRAWINGS

THE PREFERRED EMBODIMENT

Figure 1:
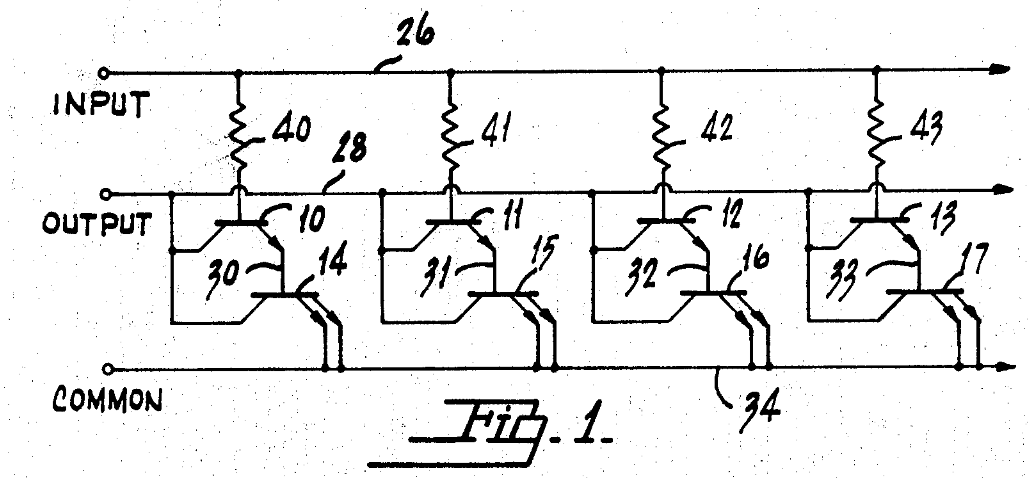
FIG. 1 is a schematic circuit diagram of the present power output circuit.

FIG. 1 is a schematic representation of the circuitry employed in the present novel integrated circuit. The circuit has a plurality of transistors 10, 11, 12, 13, 14, 15, 16 and 17 which are connected as a plurality of Darlington pairs in parallel. For this purpose, each of the bases of the transistors 10, 11, 12 and 13 in the input side of the Darlington pairs is connected to a lead 26, which constitutes an input lead for the circuit. The collectors of all of the transistors 10, 11, 12, 13, 14, 15, 16 and 17 are connected to a lead 28, which constitutes an output lead for the circuit. The emitters of each of the transistors 10, 11, 12 and 13 are connected to the bases of the transistors 14, 15, 16 and 17 by means of leads 30, 31, 32, and 33, respectively. Finally, the emitters of each of the transistors 14, 15, 16 and 17 are connected to a lead 34 which, in the operation of the circuit, is common to the input and output circuit. In the preferred embodiment, the transistors 14, 15, 16 and 17 have duel emitter structures.

Means are provided to aid in balancing the distribution of current through each of the Darlington pairs in the circuit. For this purpose, resistors 40, 41, 42 and 43, FIG. 1, are provided, each of which is connected in series between the lead 26 and the base of one of the transistors 10, 11, 12 and 13. The value of these resistors is determined by the structure of the circuit in its monolithic integrated form, as will be explained below.

The circuit of FIG. 1 is intended to be used as a power output circuit in combination with other circuitry, not shown. In its integrated form, as described hereinafter, the circuit may be used for intermittent power output applications up to 25 amperes on a standard size square chip about 70 mils on a side.

In order to coordinate the descriptions of the circuit in integrated form with the schematic diagram of FIG. 1, the same reference numerals are applied to the corresponding elements in the structural illustration of FIGS. 2 to 5. The circuit in its integrated form is designated generally by the reference numeral 56. The circuit 56 includes a chip 58 of semiconductive material, preferably silicon, which has a planar surface 60 thereon.

Figure 2:
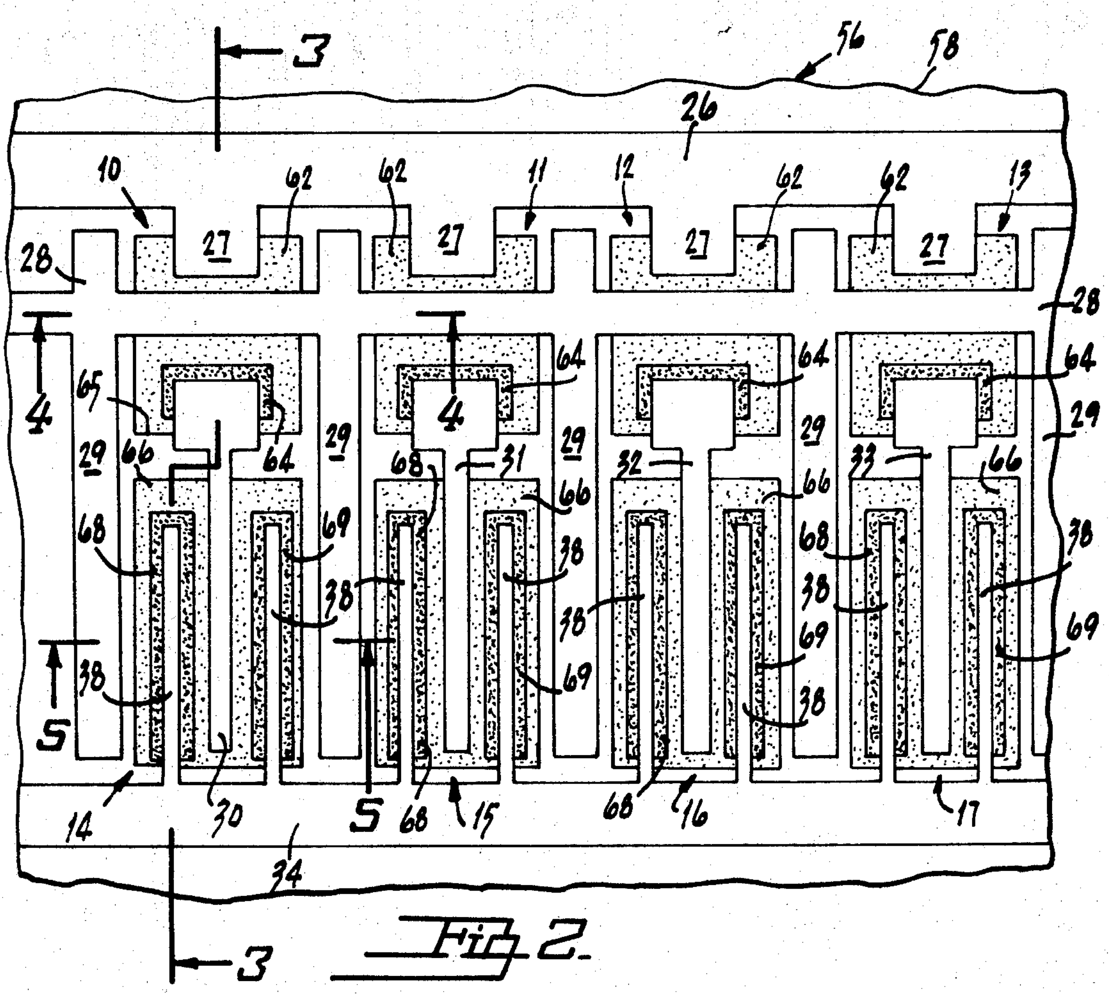
FIG. 2 is a plan view of this circuit in monolithic integrated form.
Figure 3:
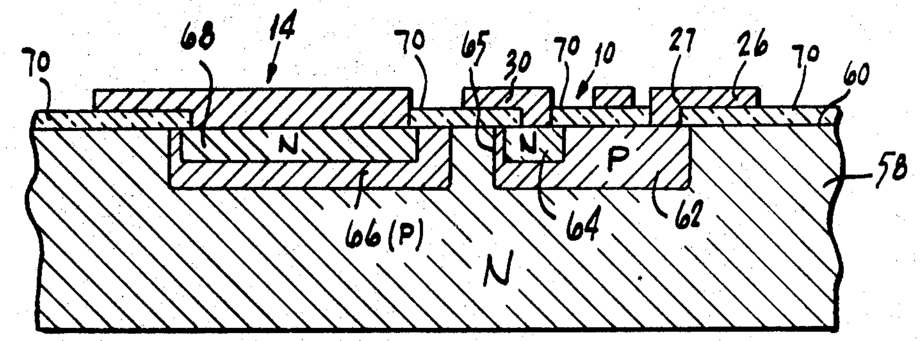
FIG. 3 is a section taken on the line 3—3 of FIG. 2.

Diffused regions defining the several transistors of the circuit are included within the chip 58 adjacent to the surface 60. FIGS. 2 and 3, for example, show the regions making up the transistors 10 and 14. The material of the chip 58 is of N type conductivity and constitutes a common collector region for all of the transistors in the circuit. This N type material may be an epitaxial layer on a P type substrate (not shown) if desired.

The transistor 10 includes a P type base region 62 (lightly stippled in FIG. 2) and an N type emitter region 63 (heavily stippled) within the base region 62 near the edge 65 thereof which is closest or adjacent to the transistor 14. The transistor 14 has a P type base region 66 and a pair of N type emitter regions 68 and 69. See FIGS. 2 and 5. The transistors 11, 12 and 13 are like the transistor 10 and the transistors 15, 16 and 17 are like the transistor 14.

The transistors 10, 11, 12 and 13 are disposed in a row and the transistors 14, 15, 16 and 17 are disposed in an adjacent parallel row. The transistors are interconnected by a metallization pattern which is applied in conventional manner by the steps of providing, on the surface 60 of the chip 58, a layer 70 of insulating material and etching openings adjacent to the active regions of the transistors. The conductive layers of the metallization pattern are disposed on the insulating layer and extend into these openings to make contact to the various regions.

The metallization includes a first conductive layer 26 which has portions 27 thereof extending into contact with the base regions 62 of the transistors 10, 11, 12 and 13 at the edge of each base region 62 which is remote from the emitter regions 64. A second conductive layer 28 has finger portions 29 thereof which extend into contact with the common collector region of all of the transistors 10, 11, 12, 13, 14, 15, 16 and 17. See FIGS. 4 and 5. The finger portions 29 extend adjacent to the base regions of all of the transistors to minimize the collector resistance thereof. A plurality of separate conductive layers 30, 31, 32 and 33 interconnect the emitter regions 64 of the transistors 10, 11, 12 and 13 and the base regions 66 of the transistors 14, 15, 16 and 17, respectively. See FIGS. 2 and 5.

Connection is made to the emitter regions of the transistors 14, 15, 16 and 17 by means of a conductive layer 34 which has finger portions 38 extending into contact with the emitter regions 68 and 69 of each of the transistors 14, 15, 16 and 17, respectively.

Figure 4:
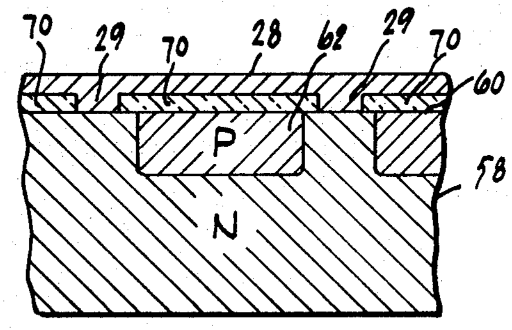
FIG. 4 is a section taken on the line 4—4 of FIG. 2.
Figure 5:
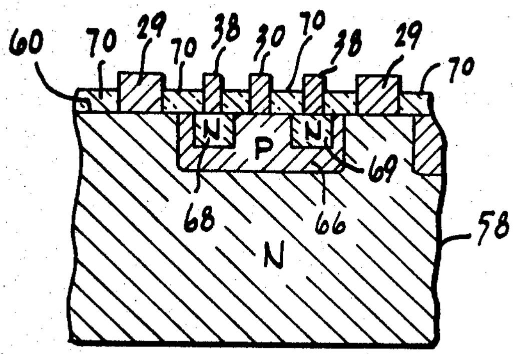
FIG. 5 is a section taken on the line 5—5 of FIG. 2.

The resistors 40, 41, 42 and 43 are constituted by portions of the base regions 62 of the transistors 10, 11, 12 and 13. In conventional practice, the base contact of a transistor is placed close to the emitter region in order to minimize base resistance, but here the base contact 27 and the emitter region 64 of each of the transistors 10, 11, 12 and 13 are placed at remote ends of the base regions 62 so that the spacing between them is relatively large. This provides the resistance desirable for current balancing and also provides space to accommodate portions of the collector conductive layer. In other words, the conductive layer 28 crosses over the base regions of the transistors 10, 11, 12 and 13. The insulating layer 70 isolates the conductive layer 28 from the base regions 62, as shown in FIG. 4.

The layout of the conductive layers as illustrated in FIG. 2 provides all the required circuit interconnections with a single layer of metallization. The circuit may therefore be fabricated relatively simply with known integrated circuit processing techniques. Any number of transistor pairs and any number of rows of transistor pairs may be employed.

The circuit described herein may be fabricated as a separate circuit on a monolithic silicon chip or it may be combined with other circuitry on a single chip. The circuit is intended primarily for power output applications and particularly to provide high current gain and impedance matching between a signal processing circuit and a load.

I claim:

1. An integrated circuit comprising a first transistor and a second transistor each having emitter, base, and collector regions, the emitter region of said first transistor being disposed within the base region of said first transistor and near that edge of said base region which is closest to said second transistor, a first conductive layer having a portion contacting the base region of said first transistor at a location near that edge of said base region which is remote from said second transistor, a second conductive layer having fingers in contact with the collector regions, and extending adjacent to the base regions, of both of said transistors and having a portion extending between the emitter region of said first transistor and said portion of said first conductive layer, a third conductive layer having a portion contacting the emitter region of said second transistor, and a fourth conductive layer having one portion contacting the emitter region of said first transistor and another portion contacting the base region of said second transistor.

2. An integrated circuit comprising:

a body of semiconductive material having a surface, means in said body defining a plurality of transistors each having emitter, base and collector regions adjacent to said surface, at least some of said transistors constituting a power output circuit and being arranged in parallel adjacent rows with the same number of transistors in each row, a layer of insulating material on said surface, said layer having contact openings adjacent to the emitter, base and collector regions of each of said transistors, a first conductive layer disposed on said insulating layer and having portions extending into contact with the base regions of all transistors in one of said rows, to interconnect said base regions, said portions contacting said base regions at locations remote from the emitters of said transistors whereby there is substantial base resistance in said transistors in said one row, a second conductive layer disposed on said insulating layer and having portions extending into contact with the collector regions of all of the transistors in both of said rows, to interconnect said collector regions, said second conductive layer having other portions extending over the base regions of the transistors in said one row at a location between the base contact and the emitter region of each, a third conductive layer disposed on said insulating layer and having portions extending into contact with the emitter regions of all transistors in another of said rows, to interconnect said emitter regions, and a plurality of separate conductive layers disposed on said insulating layer and each having portions extending into contact with the emitter region of a transistor in said one row and with the base region of a transistor in the other said row.

3. An integrated power output circuit as defined in claim 2, wherein said portions of said second conductive layer comprise fingers extending adjacent to the base regions of all of said transistors.

References Cited

UNITED STATES PATENTS

| | | | |
|---|---|---|---|
| 2,985,804 | 5/1961 | Buie | 317—235 |
| 3,264,493 | 8/1966 | Price | 307—303 |
| 3,416,043 | 12/1968 | Jorgensen | 317—235 |
| 3,442,003 | 5/1969 | Weir | 317—235 |

DONALD D. FORRER, Primary Examiner

R. C. WOODBRIDGE, Assistant Examiner

U.S. Cl. X.R.

307—218, 254, 303, 315